(12) United States Patent
Hua et al.

(10) Patent No.: US 12,413,187 B2
(45) Date of Patent: Sep. 9, 2025

(54) DOHERTY AMPLIFIERS

(71) Applicant: NXP USA, Inc., Austin, TX (US)

(72) Inventors: Qi Hua, Wu Xi (CN); Yunfei Wang, Chengdu (CN); Qi Wu, Guiyang (CN); Changyang Wang, Shanghai (CN)

(73) Assignee: NXP USA, INC., Austin, TX (US)

( * ) Notice: Subject to any disclaimer, the term of this patent is extended or adjusted under 35 U.S.C. 154(b) by 481 days.

(21) Appl. No.: 18/052,586

(22) Filed: Nov. 4, 2022

(65) Prior Publication Data

US 2024/0063756 A1 Feb. 22, 2024

(30) Foreign Application Priority Data

Aug. 18, 2022 (CN) .......................... 202210996208.8

(51) Int. Cl.
*H03F 1/02* (2006.01)
*H01L 23/00* (2006.01)
(Continued)

(52) U.S. Cl.
CPC ........... *H03F 1/0288* (2013.01); *H01L 23/66* (2013.01); *H01L 24/48* (2013.01); *H01L 25/16* (2013.01);
(Continued)

(58) Field of Classification Search
CPC .......... H03F 5/00; H03F 3/45475; H03F 3/44; H03F 3/28; H03F 3/602; H03F 7/02;
(Continued)

(56) References Cited

U.S. PATENT DOCUMENTS 6,262,629 B1 7/2001 Stengel et al.
8,022,760 B2 9/2011 Gajadharsing et al.
(Continued)

FOREIGN PATENT DOCUMENTS

CN 110417357 A * 11/2019 ........... H03F 1/0288
WO 2005043747 A2 5/2005

OTHER PUBLICATIONS

Blednov, I; "Wideband 3 Way Doherty RFIC with 12 dB Back-Off Power Range"; Proceedings of the 11th European Microwave Integrated Circuits Conference; London, UK; 4 pages (Oct. 2016).
(Continued)

*Primary Examiner* — Hafizur Rahman

(57) ABSTRACT

A Doherty amplifier includes first and second input terminals, first and second amplifiers, and an output combiner circuit. The first amplifier includes a first amplifier input coupled to the first input terminal, and a first amplifier output. The second amplifier includes a second amplifier input coupled to the second input terminal, and a second amplifier output. The output combiner circuit is coupled between the first amplifier output, the second amplifier output, and a final summing node. The output combiner circuit includes a first inductive element, a first capacitor integrated within an integrated passive device (IPD), and a second inductive element. The first inductive element is coupled between the first amplifier output and a first terminal of the first capacitor, and the second inductive element is coupled between a combining node and the first terminal of the first capacitor. A second terminal of the first capacitor is coupled to ground.

20 Claims, 13 Drawing Sheets

(51) Int. Cl.
  *H01L 23/66* (2006.01)
  *H01L 25/16* (2023.01)
  *H03F 1/56* (2006.01)
  *H03F 3/195* (2006.01)

(52) U.S. Cl.
  CPC ............. *H03F 1/565* (2013.01); *H03F 3/195* (2013.01); *H01L 2223/6611* (2013.01); *H01L 2223/6655* (2013.01); *H01L 2223/6672* (2013.01); *H01L 2224/48011* (2013.01); *H01L 2224/48091* (2013.01); *H01L 2224/48195* (2013.01); *H01L 2924/19011* (2013.01); *H01L 2924/19041* (2013.01); *H01L 2924/19042* (2013.01); *H01L 2924/19043* (2013.01); *H01L 2924/19105* (2013.01); *H01L 2924/2027* (2013.01); *H01L 2924/30111* (2013.01); *H03F 2200/391* (2013.01)

(58) Field of Classification Search
  CPC .......... H03F 3/45085; H03F 3/26; H03F 3/88; H03F 1/14; H03F 3/21; H03F 2200/372; H03F 3/68; H03G 1/0023; H03G 1/00; H01L 2924/3011
  USPC ....... 330/3, 69, 74, 116, 117, 124, 134, 252, 330/254, 262, 275, 284, 292, 295, 301, 330/307, 124 R; 375/296–297; 455/114.3
  See application file for complete search history.

(56) References Cited

U.S. PATENT DOCUMENTS

| | | |
|---|---|---|
| 8,228,123 B2 | 7/2012 | Blednov |
| 8,653,889 B1* | 2/2014 | Acimovic ............... H03F 3/245 |
| | | 330/124 R |
| 9,509,252 B2 | 11/2016 | Moronval et al. |
| 10,038,407 B2 | 7/2018 | Moronval et al. |
| 2005/0231278 A1 | 10/2005 | Blednov |
| 2009/0174482 A1 | 7/2009 | Blednov |
| 2014/0062601 A1 | 3/2014 | Acimovic et al. |
| 2015/0145601 A1* | 5/2015 | Moronval ................. H03F 1/07 |
| | | 330/295 |
| 2020/0186097 A1* | 6/2020 | Hue ........................ H03F 3/604 |

OTHER PUBLICATIONS

Cygan Lawrence F. "A High Efficiency Linear Power Amplifier for Portable Communications Applications", IEEE Compound Semiconductor Integrated Circuit Symposium, 2005. CSIC '05., 2005, 5 pages.

Maroldt, Stephan et al; "3.5-GHz Ultra-Compact GaN Class-E Integrated Doherty MMIC PA for 5G massive-MIMO Base Station Applications"; Proceedings fo the 12th European Microwave Integrated Circuits Conference, Nuremberg DE; 4 pages (Oct. 9-10, 2017).

Unknown; "A Compact 60 W MMIC Amplifier based on a Novel 3-Way 1:2:1 Doherty Architecture with Best-in-Class Efficiency for Small Cells"; IEEE MTT-S Intl Microwave Symposium; 4 pages (2017).

U.S. Appl. No. 17/929,527, filed Sep. 2, 2022, not yet publish, 38 pages—US counterpart of CN Application 202111038476.0.

Zhang, Hao et al; "A 50W Highly Linear 3-Way Integrated Wideband Doherty PA for Small-Cell Application"; Proceedings of the 48th European Microwave Conference; 4 pages (2018).

* cited by examiner

DOHERTY AMPLIFIERS

CROSS-REFERENCE TO RELATED APPLICATIONS

This application claims priority under 35 U.S.C. § 119 to Chinese patent application no. 202210996208.8, filed on 18 Aug. 2022, the contents of which are incorporated by reference herein.

BACKGROUND

The present application is generally directed to amplifiers, and more particularly to Doherty amplifiers and devices used in the Doherty amplifiers.

With the development of the 5G communication market, energy savings at the low traffic state become more and more important. Therefore, more and more telecom operators require high efficiency at the low traffic state (e.g., typically half output power of normal operations, or even more less), meanwhile requiring the same or even higher efficiency at normal operational output power.

2-way and 3-way Doherty amplifier circuits are often considered for use in 5G base stations, because they tend to have relatively high efficiency. The 3-way Doherty amplifier circuit usually has a complex output combiner, together with output matching networks for each individual path. Accordingly, it takes a large amount of printed circuit board (PCB) room to accommodate them. In the macro base station, the circuit size may be not a big problem because it does not have many channels (e.g., 2 channels or 4 channels, typically). However, a 5G Massive MIMO communication system requires multiple channels of high efficiency power amplifiers in each 5G base station. Either 32T (32 channels) or 64T (64 channels) is a common requirement, and therefore implementing Doherty amplifiers in Massive MIMO systems brings many challenges, especially on the circuit size, as well as the cost.

Therefore, there remains a need for Doherty amplifiers which may have the advantages of size reduction, cost savings and high efficiency, both at deep back-off and normal output power levels.

SUMMARY

This summary is provided to introduce a selection of concepts in a simplified form that are further described below in the Detailed Description. This summary is not intended to be relied on to identify important features or essential features of the claimed subject matter, nor is it intended to be used to limit the scope of the claimed subject matter.

According to one aspect of the application, it provides a Doherty amplifier device, comprising:
a first input terminal;
a second input terminal;
a third input terminal;
an integrated output combiner circuit comprising a first output network, a second output network and a third output network, an intermediate summing node, and a final summing node;
a main amplifier including a first amplifier input coupled to the first input terminal, and a first amplifier output coupled to the first output network;
a first peaking amplifier including a second amplifier input coupled to the second input terminal, and a second amplifier output coupled to the second output network through the intermediate summing node; and
a second peaking amplifier including a third amplifier input coupled to the third input terminal, and a third amplifier output coupled to the third output network;
wherein the first output network is coupled between the first amplifier output and the final summing node, the second output network coupled between the second amplifier output and the final summing node, and the third output network coupled between the third amplifier output and the intermediate summing node;
wherein the first output network imparts a phase delay of 90 degrees between an input of the first output network and an output of the first output network and provide a first impedance, the second output network imparts a phase delay of 90 degrees between an input of the second output network and an output of the second output network and provide a second impedance, and the third output network imparts a phase delay of 90 degrees between an input of the third output network and an output of the third output network and provide a third impedance; wherein the first output network comprises a first inductive element coupled between the first amplifier output and a first intermediate node, a first capacitor integrated within a first integrated passive device (IPD) and coupled between the first intermediate node and ground, and a second inductive element coupled between the first intermediate node and the final summing node.

According to the second aspect of the application, it provides a Doherty amplifier, comprising:
a first input;
a second input;
a third input;
an output;
an output combiner circuit with three combining network inputs, multiple summing nodes, and a combining network output coupled to the output directly;
a main amplifier including a first amplifier input coupled to the first input, and a first amplifier output coupled to a first combining network input of the three combining network inputs;
a first peaking amplifier including a second amplifier input coupled to the second input, and a second amplifier output coupled to a second combining network input of the three combining network inputs; and
a second peaking amplifier including a third amplifier input coupled to the third input, and a third amplifier output coupled to a third combining network input of the three combining network inputs;
wherein the phase shift between the first amplifier input and the second amplifier input is 0°, and the phase shift between the second amplifier input and the third amplifier input is 90°;
wherein the multiple summing nodes of the output combining network include a final summing node and an intermediate summing node, and wherein the intermediate summing node is coupled to the second combining network input directly;
wherein the output combiner circuit comprises a first output network between the first amplifier output and the combining network output, a second output network between the intermediate summing node and the final summing node and a third output network between the third amplifier output and the intermediate summing node; wherein the first output network imparts a phase delay of 90 degrees between an input of the first output network and an output of the first output network and provide a first impedance, the second output network imparts a phase delay of 90 degrees between an input of the second output network and an output of the second output network and provides a second impedance, and the third output network imparts a phase delay of 90 degrees between an input of the third output network and an output of the third output network and provides a third impedance, and the first output network comprises a first inductive element coupled between the first amplifier output and a first intermediate node, a first capacitor integrated within a first integrated passive device (IPD) and coupled between the first intermediate node and ground, and a second inductive element coupled between the first intermediate node and the final summing node.

According to the third aspect of the application, it provides a Doherty amplifier device, comprising:

a first input terminal;

a second input terminal;

an integrated output combiner circuit comprising a first output network and a second output network;

a main amplifier including a first amplifier input coupled to the first input terminal, and a first amplifier output coupled to the first output network; and a peaking amplifier including a second amplifier input coupled to the second input terminal, and a second amplifier output coupled to the second output network, wherein the first output network comprises a first inductive element coupled between the first amplifier output and a first terminal of a first capacitor that is integrated within a first integrated passive device (IPD), a second inductive element coupled between a final summing node and the first terminal of the first capacitor, and wherein a second terminal of the first capacitor is coupled to ground, and wherein the second output network comprises a third inductive element coupled between the second amplifier output and a first terminal of a second capacitor that is integrated within a second IPD, a fourth inductive element coupled between the final summing node and the first terminal of the second capacitor, and wherein a second terminal of the second capacitor is coupled to ground.

BRIEF DESCRIPTION OF THE DRAWINGS

So that the manner in which the above recited features of the present application can be understood in detail, a more particular description of the application, briefly summarized above, may be had by reference to embodiments, some of which are illustrated in the appended drawings. It is to be noted, however, that the appended drawings illustrate only typical embodiments of this application and are therefore not to be considered limiting of its scope, for the application may admit to other equally effective embodiments. The drawings are for facilitating an understanding of the application and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
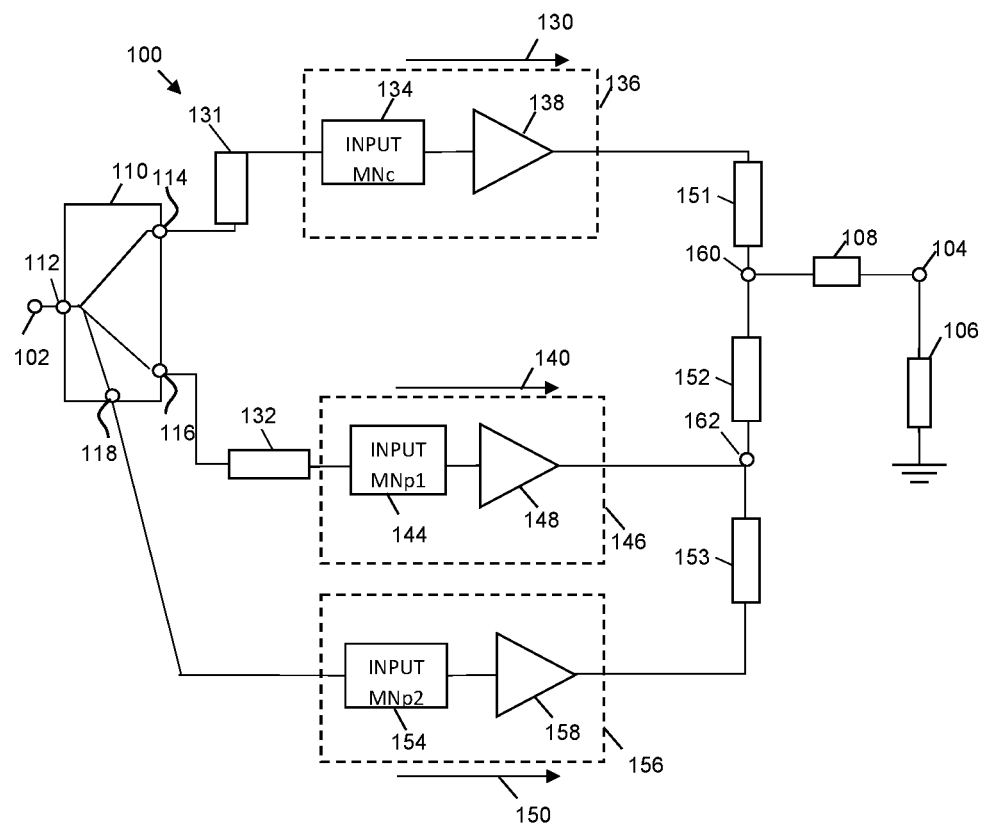
FIG. 1 illustrates a simplified schematic diagram of a Doherty amplifier with transmission lines.

FIG. 1 is a simplified schematic diagram of a three-way Doherty amplifier 100. Amplifier 100 includes a single input terminal 102, an final summing node 104, a power splitter 110, a first amplifier path 130, a second amplifier path 140, a third amplifier path 150, and a combining terminal 160. A load 106 (e.g., an antenna) may be coupled to the combining terminal 160 through an impedance transformer 108. The impedance transformer 108 may impart a 90 degree phase delay to the output RF signal before it is supplied to the load 106.

Power splitter 110 is configured to divide the input power of an input signal 102 received at power splitter input 112 into carrier and peaking portions of the input signal. The carrier input signal is provided to the first amplifier path 130 at power splitter output 114, a first peaking input signal is provided to the second amplifier path 140 at power splitter output 116, and a second peaking input signal is provided to the third amplifier path 150 at power splitter output 118. During operation in a full-power mode when all of the carrier amplifier 136, second amplifiers 146 and third amplifier 156 are supplying current to the load 106, the power splitter 110 divides the input signal power among the amplifier paths 130, 140 and 150. The power splitter 110 may divide the power unequally. For example, the power splitter 110 may divide the power 1:1.5:1.5, such that the Doherty amplifier 100 has a 1:1.5:1.5 configuration.

Essentially, the power splitter 110 divides an input RF signal supplied at the input terminal 102, and the divided signals are separately amplified along the first, second and third amplifier paths 130, 140, 150. The amplified signals are then combined in phase at the combining terminal 160. It is important that phase coherency between the first, second and third amplifier paths 130, 140, 150 is maintained across a frequency band of interest to ensure that the amplified carrier and peaking signals arrive in phase at the combining terminal 160, and thus to ensure proper Doherty amplifier operation.

Each of the first amplifier 136, the second amplifier 146 and the third amplifier 156 includes one or more single stage or multiple-stage power transistor integrated circuits (ICs) 138, 148, 158 for amplifying an RF signal conducted through the amplifier 136, 146, 156. These power transistor ICs may be implemented, for example, using silicon-based field effect transistors (FETs) (e.g., laterally diffused metal oxide semiconductor FETs, or LDMOS FETs), gallium nitride (GaN)-based FETs (e.g., high electron mobility transistors), or other types of power transistors. Although the carrier and peaking power transistor ICs may be of equal size (e.g., in a symmetric Doherty configuration), the carrier and peaking power transistor ICs may have unequal sizes, as well (e.g., in various asymmetric Doherty configurations). In an asymmetric Doherty configuration, the peaking power transistor ICs typically are larger than the carrier power transistor IC(s) by some multiplier.

During operation of Doherty amplifier 100, first amplifier stage 136 is biased to operate in class AB mode, and second and third amplifier stages 146, 156 are biased to operate in class C mode. More specifically, the transistor arrangement of first amplifier stage 136 is biased to provide a conduction angle between 180 and 360 degrees. Conversely, the transistor arrangement of the second and third amplifier stages 146, 156 are biased to provide a conduction angle less than 180 degrees.

At low power levels, where the power of the input signal at terminal 102 is lower than the turn-on threshold level of second amplifier 146, the amplifier 100 operates in a low-power (or back-off) mode in which the first amplifier 136 is the only amplifier supplying current to the load 106. When the power of the input signal exceeds a threshold level of the second amplifier 146, the amplifier 100 operates in a high-power mode in which the first amplifier 136, the second amplifier 146 and the third amplifier 156 together supply current to the load 106. At this point, the second amplifier and third amplifier 146, 156 provides active load modulation at combining terminal 160, allowing the current of the first amplifier 136 to continue to increase linearly.

Input impedance matching network 134 (input MNc) may be implemented at the input of the first amplifier 136. Similarly, input impedance matching network 144 (input MNp1) may be implemented at the input of the second amplifier 146 and input impedance matching network 154 (input MNp2) may be implemented at the input of the third amplifier 156. In each case, the matching networks 134, 144, 154 may be used to incrementally increase the circuit impedance toward the load impedance. In addition, the first amplifier 136, the second amplifier 146 and the third amplifier 156 may have additional pre-matching input and/or output impedance matching networks (not illustrated) that are either integrated with the power transistor dies, or integrated within the power transistor die packages.

Doherty amplifier 100 has a "inverted" load network configuration. In the inverted configuration, the input circuit is configured so that an input signal supplied to the first amplifier 136 and the second amplifier 146 are delayed by 90 degrees with respect to the input signal supplied to the third amplifier 156 at the center frequency of operation, fo, of the amplifier 100. To ensure that the carrier and peaking input RF signals fundamental to proper Doherty operation, a first phase delay element 131 and a second phase delay element 132 are provided, in the input paths to the first amplifier 136 and the second amplifier 146 respectively, which apply about 90 degrees of phase delay to the carrier input signal and the first peaking input signal. For example, each of the phase delay element 131 and the phase delay element 132 may be a quarter wave transmission line, another suitable type of delay element with an electrical length of about 90 degrees.

Delay elements 151 and 152 are implemented between the outputs of the first and second amplifiers 136, 146 and the combining terminal 160. To compensate for the resulting 90 degree phase delay difference between second and third amplifier paths 140, 150 at the inputs of amplifiers 146, 156 (i.e., to ensure that the amplified signals arrive in phase at the combining terminal 160), the output circuit is configured to apply about a 90 degree phase delay to the signal between the output of second amplifier 146 and the output of third amplifier 156. This is achieved through an additional delay element 153. Delay element 151 is configured to apply about a 90 degree phase delay to the signal between the output of first amplifier 136 and the combining terminal 160, and delay element 152 is configured to apply about a 90 degree phase delay to the signal between the output of second amplifier 146 and the combining terminal 160.

In a printed circuit board (PCB) implementation of amplifier 100, delay elements 151, 152, 153 are implemented as quarter-wave transmission lines or "quasi" transmission lines (e.g., a transmission line coupled to an amplifier with bond wires). However, the transmission line types of delay elements 151-153 are not readily able to be integrated in discreate power amplifier devices with certain common package types (e.g. dual flat no-leads, DFN, packages), because such types of packages do not include internal substrates that are suitable for supporting transmission lines.

Figure 2A:
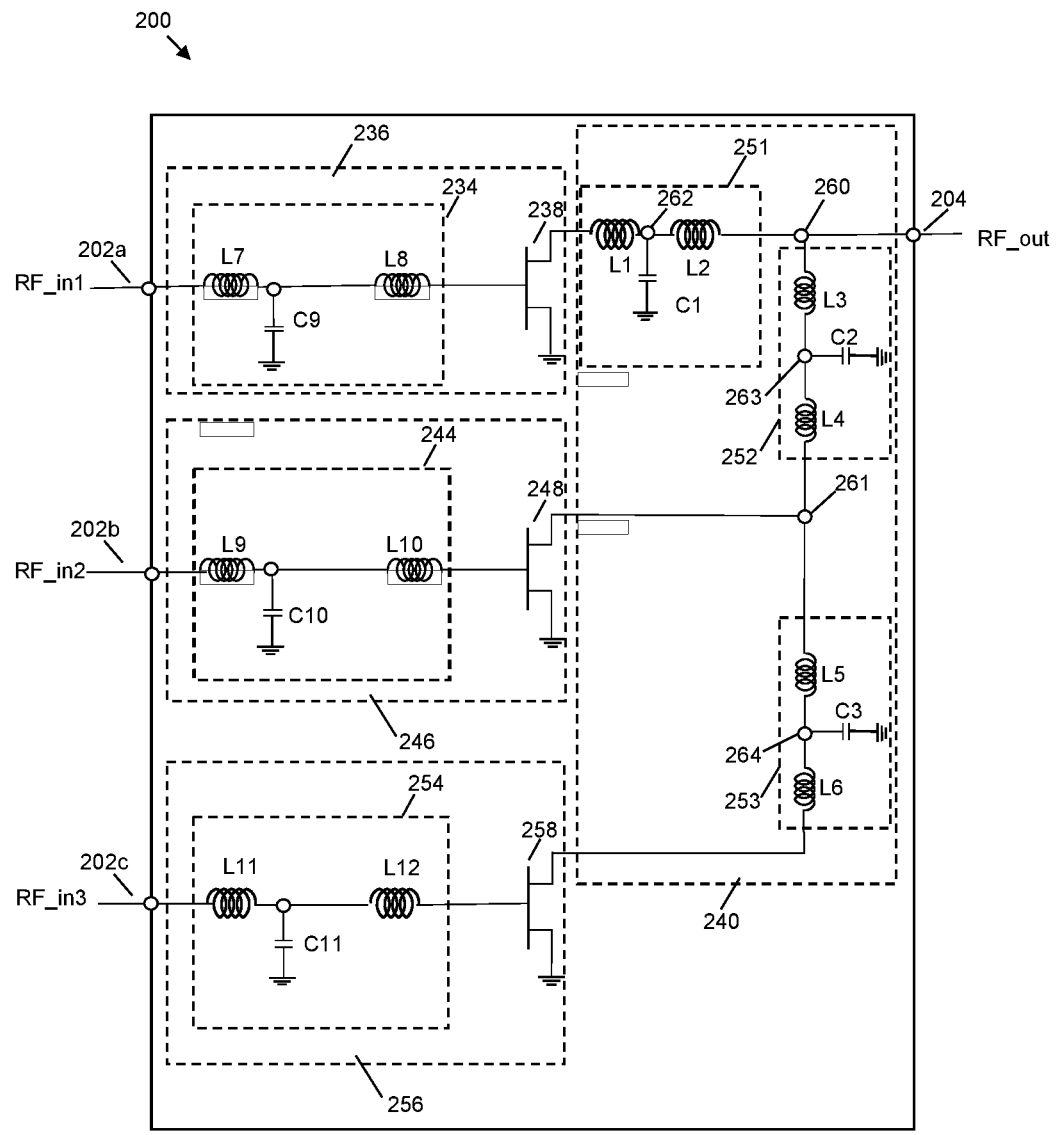
FIG. 2A illustrates a 3-way Doherty amplifier in accordance with an embodiment.

FIG. 2A is a simplified schematic diagram of a 3-way Doherty amplifier 200 in accordance with an embodiment. Amplifier 200 includes three separate inputs 202a, 202b and 202c, an output 204, a first amplifier 236 (also referred to as a first transistor, below), a second amplifier 246 (also referred to as a second transistor, below), a third amplifier 256 (also referred to as a third transistor, below), and an output combiner circuit 240.

A first signal (RF_in1) received at the first input 202a is amplified by the first amplifier 236. A second signal (RF_in2) received at the second input 202b is amplified by the second amplifier 246. A third signal (RF_in3) received at the third input 202c is amplified by the second amplifier 256.

The first amplifier 236 includes a first transistor (carrier transistor) 238 which may comprise a control terminal coupled to the input 202a, a source terminal coupled to ground, and a drain terminal as a first amplifier output.

The second amplifier 246 includes a second transistor (first peaking transistor) 248 which may comprise a control terminal coupled to the second input 202b, a source terminal coupled to ground, and a drain terminal as a second amplifier output.

The third amplifier 256 includes a third transistor (second peaking transistor) 258 which may comprise a control terminal coupled to the third input 202c, a source terminal coupled to ground, and a drain terminal as a third amplifier output.

The output combiner circuit 240 is coupled to the first amplifier output and the second amplifier output and the third amplifier output. The output combiner circuit 240 may comprise a first output network 251, a second output network 252 and a third output network 253. The first output network 251 may be coupled between the first amplifier output and a final summing node 260. The second output network 252 may be coupled between the final summing node 260 (and the first amplifier output) and an intermediate summing node 261. The third output network 253 may be coupled between the third amplifier output and the intermediate summing node 261.

The first output network 251 comprises a first inductive element L1 coupled between the first amplifier output and an intermediate node 262, a first capacitor C1 coupled between the intermediate node 262 and ground, and a second inductive element L2 coupled between the intermediate node 262 and the final summing node 260. The first inductive element L1 comprises a set of bond wires, and the second inductive element comprises another set of bond wires. The Doherty amplifier 200 comprises integrated passive devices (IPD) (shown in FIG. 3). The first capacitor C1 is integrally formed in an IPD. The first output network 251 in association with the parasitic output capacitance (Cds_c, FIG. 2B) of the first transistor 236 and a shunted capacitance, C1, that is equal to Cds_c are used instead of a quasi quarter-wave transmission line (TL), to provide a 90° phase shift for the output of the first amplifier and the equivalent impedance is Z1.

The second output network 252 comprises a third inductive element L3 coupled between the final summing node 260 and a second intermediate node 263, a second capacitor C2 coupled between the second intermediate node 263 and ground, a fourth inductive element L4 coupled between the intermediate summing node 261 and the second intermediate node 263. Usually, when the second transistor is larger than the third transistor, then the output parasitic capacitance Cds_p1 (FIG. 2B) of the second transistor can be split into two capacitances C7 and C8. C8 may have a capacitance value chosen to equal the output parasitic capacitance of the third transistor (Cds_p2, FIG. 2B). Then, the capacitance value of C7 may be chosen to equal capacitance Cds_P1 minus capacitance Cds_p2. The second output network 251 in association with the capacitance C7 and a shunted capacitance C6 that is chosen to equal to C7 are used instead of a quasi quarter-wave transmission line (TL), to provide a 90° phase shift for the output of the second amplifier and the equivalent impedance is Z2.

The third output network 253 comprises a fifth inductive element L5 coupled between the intermediate summing node 261 and a third intermediate node 264, a third capacitor C3 coupled between the third intermediate node 264 and ground, and a sixth inductive element L6 coupled between the third intermediate node 264 and the third amplifier output. The third output network 253 in association with the output parasitic capacitance Cds_p1 (FIG. 2B) of the second transistor 248 and the output parasitic capacitance Cds_p2 (FIG. 2B) of the third transistor 258 are used instead of a quasi quarter-wave transmission line (TL), to provide a 90° phase shift for the output of the third amplifier and the equivalent impedance is Z3.

Figure 2B:
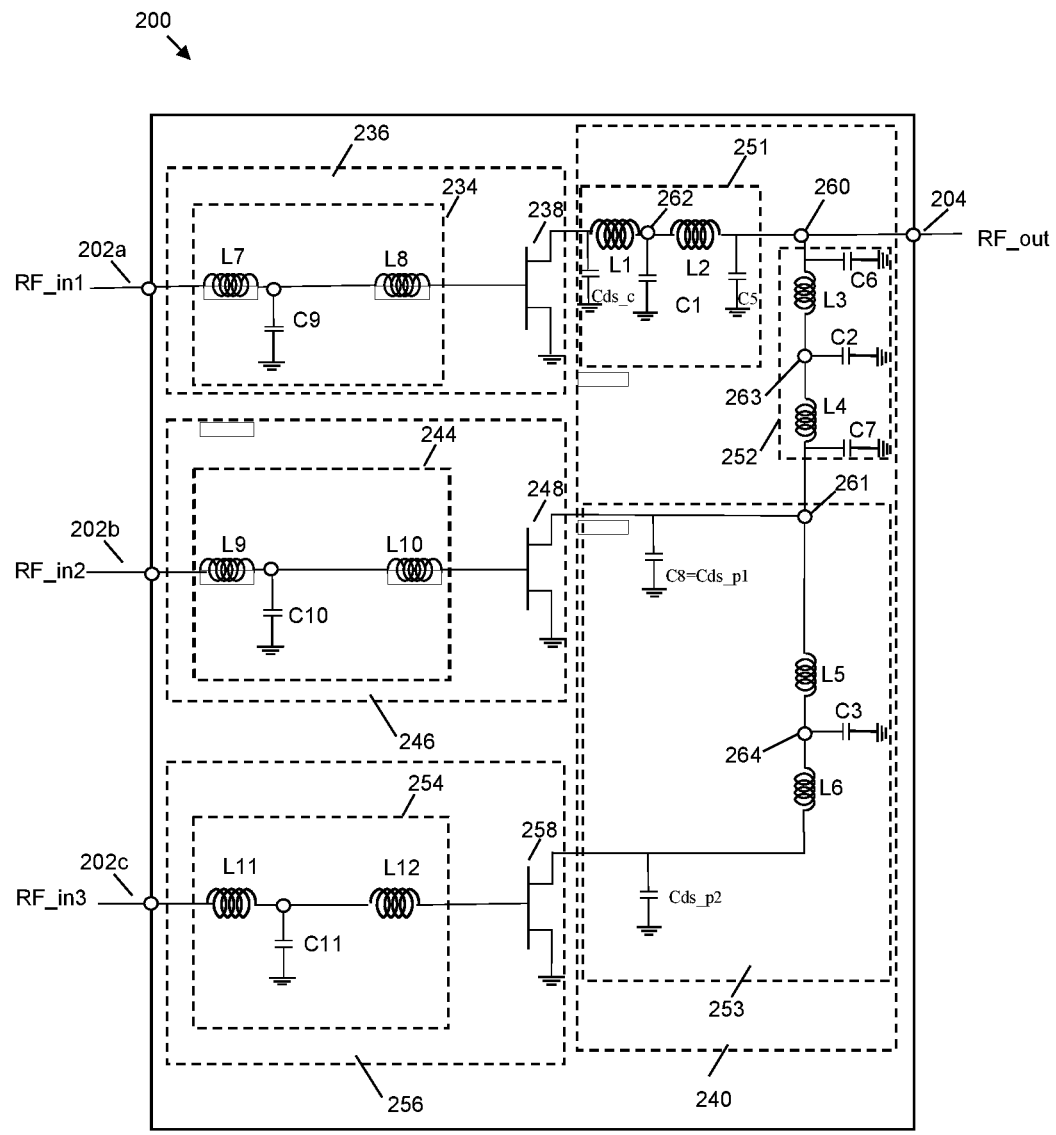
FIG. 2B illustrates a 3-way Doherty amplifier using C-L-C-L-C circuits in accordance with an embodiment.

FIG. 2B shows a Doherty amplifier comprising an output combiner using C-L-C-L-C circuits. The Doherty amplifier of FIG. 2B differs from the Doherty amplifier of FIG. 2A, in that the Doherty amplifier of FIG. 2B depicts the parasitic capacitances of the first, second, and third transistors (Cds_c, Cds_p1, and Cds_p2). In addition, the Doherty amplifier of FIG. 2B also includes additional shunt capacitors. For example, shunt capacitor C5 in the first output network 251 is coupled between summing node 260 and ground. Shunt capacitors C6 and C7 are included in the second output network 252, and they are coupled between ground and summing nodes 260 and 261, respectively. As shown in FIG. 2B, each of the first output network 251, the second output network 252 and the third output network 253 each comprise a C-L-C-L-C circuit, where the output parasitic capacitance of the first transistor (Cds_c), the output parasitic capacitance of the second transistor (Cds_p1) and the output parasitic capacitance of the third transistor (Cds_p2) are included in each C-L-C-L-C network.

Figure 2C:
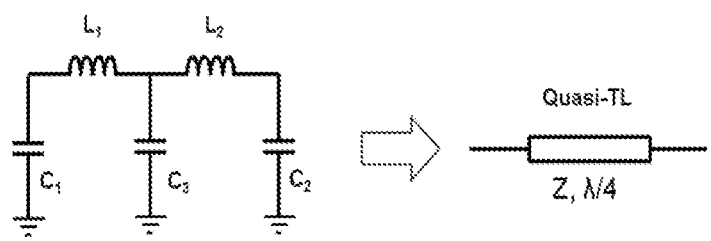
FIG. 2C illustrates a quasi quarter-wave transmission line formed by a C-L-C-L-C circuit.

FIG. 2C shows a model of the quasi quarter-wave TL formed by a C-L-C-L-C circuit. To form the quasi quarter-wave TL, given C1, C2 and L1, the values of L2, C3 and the characteristic impedance of the quasi quarter-wave TL (Z) could be obtained by the below equations (there are two alternative solutions for L2, C1 and Z1: the equation group (1) is one solution, and the equation group (2) is another).

$$\begin{cases} L_2 = \dfrac{1 - \sqrt{4\omega^4 C_1 C_2 L_1^2 - 4\omega^2 C_2 L_1 + 1}}{2\omega^2 C_2} \\ C_3 = \dfrac{C_1\sqrt{4\omega^4 C_1 C_2 L_1^2 - 4\omega^2 C_2 L_1 + 1} - (C_1 + 2\omega^2 C_1 C_2 L_1 - 2C_2)}{(\omega^2 C_1 L_1 - 1)\sqrt{4\omega^4 C_1 C_2 L_1^2 - 4\omega^2 C_2 L_1 + 1} - (\omega^2 C_1 L_1 - 1)} \\ Z = \dfrac{-\sqrt{4\omega^4 C_1 C_2 L_1^2 - 4\omega^2 C_2 L_1 + 1} - (2\omega^2 C_2 L_1 - 2\omega^4 C_1 C_2 L_1^2 - 1)}{(\omega^3 C_1 C_2 L_1 - \omega C_2)\sqrt{4\omega^4 C_1 C_2 L_1^2 - 4\omega^2 C_2 L_1 + 1} - (\omega^3 C_1 C_2 L_1 - \omega C_2)} \end{cases} \quad (1)$$

$$\begin{cases} L_2 = \dfrac{1 + \sqrt{4\omega^4 C_1 C_2 L_1^2 - 4\omega^2 C_2 L_1 + 1}}{2\omega^2 C_2} \\ C_3 = \dfrac{C_1\sqrt{4\omega^4 C_1 C_2 L_1^2 - 4\omega^2 C_2 L_1 + 1} - (C_1 + 2\omega^2 C_1 C_2 L_1 - 2C_2)}{(\omega^2 C_1 L_1 - 1)\sqrt{4\omega^4 C_1 C_2 L_1^2 - 4\omega^2 C_2 L_1 + 1} - (\omega^2 C_1 L_1 - 1)} \\ Z = \dfrac{-\sqrt{4\omega^4 C_1 C_2 L_1^2 - 4\omega^2 C_2 L_1 + 1} + (2\omega^2 C_2 L_1 - 2\omega^4 C_1 C_2 L_1^2 - 1)}{(\omega^3 C_1 C_2 L_1 - \omega C_2)\sqrt{4\omega^4 C_1 C_2 L_1^2 - 4\omega^2 C_2 L_1 + 1} + (\omega^3 C_1 C_2 L_1 - \omega C_2)} \end{cases} \quad (2)$$

Referring back to FIG. 2B, for simplicity in the real practice, we could let C5 equal to Cds_c, C8 equal to Cds_p1 and C6 equal to C7, and then it results in L1=L2, L3=L4 and L5=L6. In this condition, Given that the Cds of the carrier and peaking transistors are known, the values of C1, C2, C3 and the characteristic impedance Z1, Z2 and Z3 can be adjusted by L1, L3, and L5, respectively.

The impedance at the final summing node 260 is not the real resistance (RL) but a complex one including RL, C5 and C6. Therefore, nine components (L1-L6, C1, C2 and C3) are used to form a 3-way Doherty combiner. The L1, L2, L3, L4, L5 and L6 could be implemented by bond wires, while C1, C2 and C3 can be IPD capacitors (see FIG. 3). Using bond wires as inductors is very low cost and has a very good quality factor and high value of self-resonance.

Figure 3:
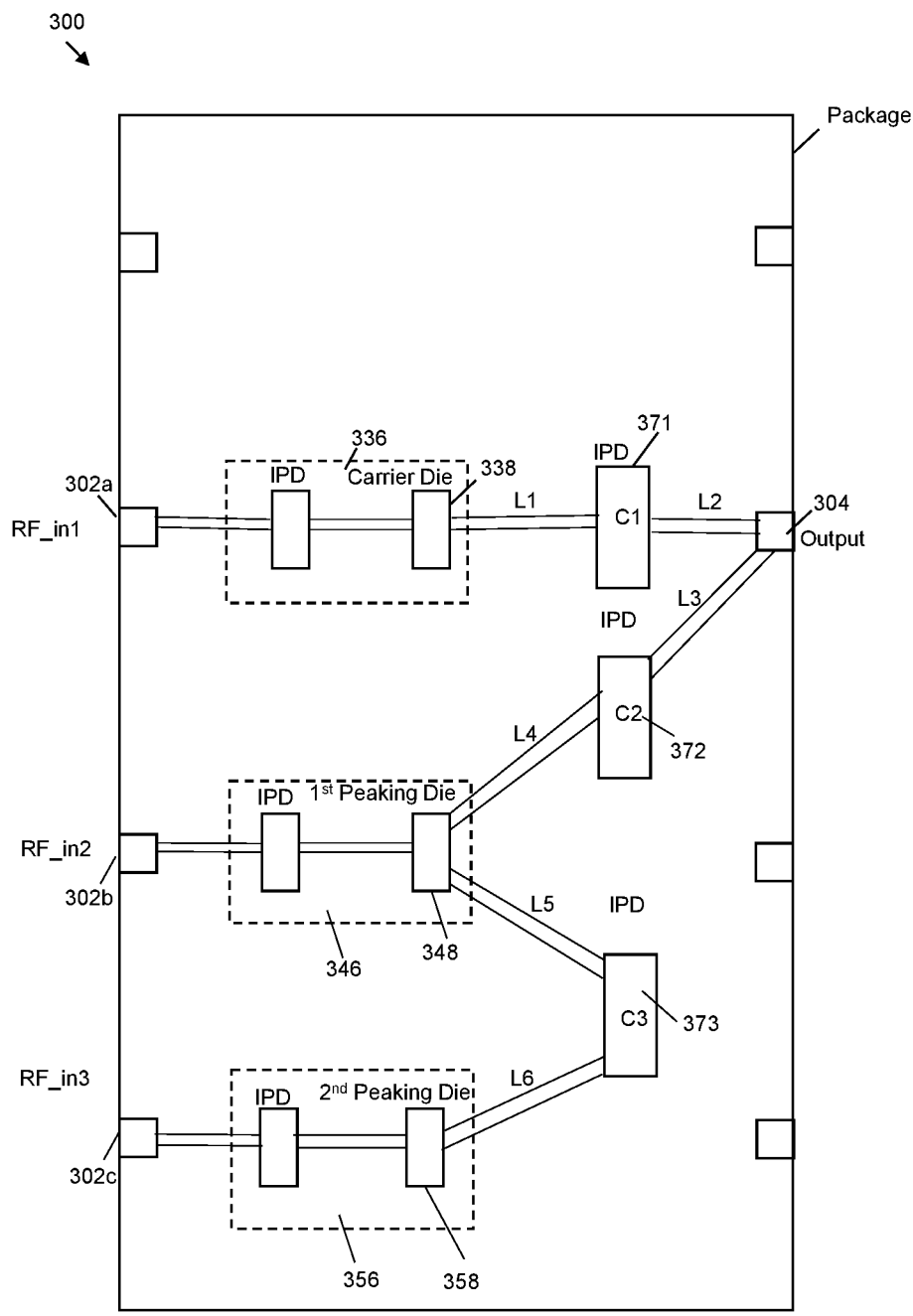
FIG. 3 illustrates the physical layout of a 3-way Doherty amplifier device in accordance with an embodiment.

FIG. 3 is a simplified schematic diagram of an amplifier device 300 in accordance with an embodiment. The packaged amplifier device 300 is a part of a Doherty amplifier.

The device may include a "flat no-leads" device package (e.g., a quad-flat no-leads QFN or dual-flat no-leads (DFN) device). Such a device includes a "lead frame" consisting of a conductive central flange ("exposed thermal paddle") and a plurality of perimeter IO pads or leads (referred to as "pin pads" in the application). The flange and the pads are held in fixed orientation with respect to each other (and electrically isolated from each other) with plastic.

The various amplifier dies and the "integrated passive devices" (IPDs) referred to in the application may be all directly attached to the conductive flange, and bond wires may be connected between the top internal surfaces of the pin pads and the dies/IPDs. Plastic molding compound may be then applied over the dies to encapsulate the device. When connected to a PCB, the flange is typically grounded; this provides a ground reference for the encapsulated dies/IPDs. Such a device is typically a surface mount device, so the bottom surfaces of the pin pads are connected (e.g., soldered) to corresponding pads on the top surface of the PCB.

An IPD, as discussed herein, is a, typically small, semiconductor die that includes only "passive" components (e.g., capacitors, resistors, inductive elements) integrated therein, as opposed to an "active" device that is a semiconductor die that includes a transistor. In this application, each IPD may include a bond pad on its top surface to which a bond wire may be connected. The IPD includes an integrated, internal capacitor (usually a "metal insulator metal" or MIM capacitor). One terminal of the capacitor is connected to the top bond pad. The other terminal of the capacitor is connected to a conductive layer on the bottom of the IPD. When the IPD is connected (e.g., using solder) to the top surface of the conductive package flange, the second terminal of the capacitor may be grounded.

Referring again to FIG. 3, the physical layout of an amplifier device 300 is illustrated according to one or more embodiments. The packaged amplifier device 300 comprises a first input lead 302a, a second input lead 302b and a third input lead 302c, an output lead 304 on another pin pad, a first amplifier 336, a second amplifier 346, a third amplifier 356, a first inductive element L1, a second inductive element L2, a third inductive element L3, a fourth inductive element L4, a fifth inductive element L5, a sixth inductive element L6, a first capacitor C1, a second capacitor C2, and a third capacitor C3. The various leads 302a, 302b, 302c, 360 each could be a terminal (or pin) of a no-leads package, for example. The L1, L2, L3, L4, L5 and L6 inductive elements each could be implemented by bond wires. The C1, C2, and C3 capacitors each could be implemented as an integrated capacitor within IPDs 371, 372, and 373, respectively. Each of the inductive elements and the capacitors in FIG. 3 correspond to the same-numbered components in FIGS. 2A and 2B.

The first amplifier 336 (e.g., a carrier amplifier of a Doherty amplifier) may include a first transistor 338. The first transistor 338 comprises a first transistor input coupled to a first input lead 302a (e.g., through two sets of bond wires and a first input IPD, as shown), and a first transistor output. The second amplifier 346 (e.g., a first peaking amplifier of a Doherty amplifier) comprises a second transistor 348. The second transistor 348 includes a second transistor input coupled to the second input lead 302b (e.g., through two sets of bond wires and a second input IPD, as shown), and a second transistor output. The third amplifier 356 (e.g., a second peaking amplifier of a Doherty amplifier) comprises a third transistor 358. The third transistor 358 includes a third transistor input coupled to the third input lead 302c (e.g., through two sets of bond wires and a third input IPD, as shown), and a third transistor output.

The first inductive element L1 is coupled between the first transistor output and a first terminal of the first capacitor C1, and the second inductive element L2 is coupled between the output lead 304 and the first terminal of the first capacitor C1. The second terminal of the first capacitor C1 is coupled to ground.

The third inductive element L3 is coupled between the output lead 304 and a first terminal of the second capacitor C2, and the fourth inductive element L4 is coupled between the second amplifier output and the first terminal of the second capacitor C2. The second terminal of the second capacitor C2 is coupled to ground.

The fifth inductive element L5 is coupled between the second amplifier output and the first terminal of the third capacitor C3, and the sixth inductive element L6 is coupled between the second amplifier output and the first terminal of the third capacitor C3. The second terminal of the third capacitor C3 is coupled to ground.

Figure 4:
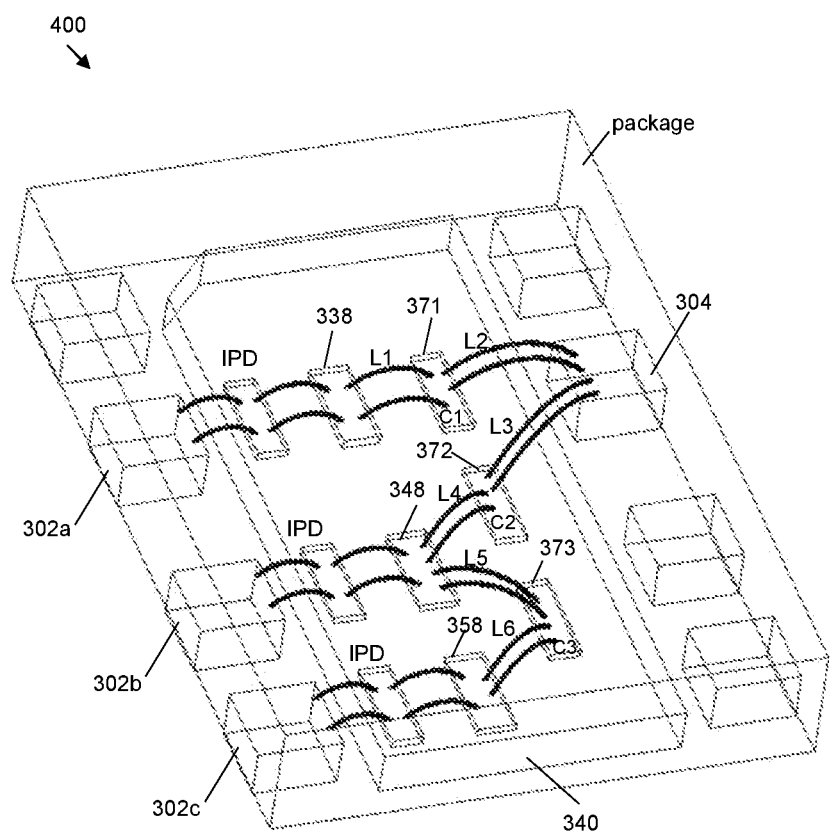
FIG. 4 illustrates a schematic perspective diagram of a packaged amplifier device corresponding to the Doherty amplifier of FIG. 3 in accordance with an embodiment.

FIG. 4 illustrates a schematic perspective diagram of a packaged amplifier device of FIG. 3 in accordance with an embodiment. In one embodiment, the packaged device is a dual-flat no-leads (DFN) device. All components of the Doherty amplifier 300 are arranged on a common conductive substrate or flange 340, which may provide a common ground plane for connections to the various grounded capacitances and the source connections of the first, second, and third amplifier transistors. In other embodiments, the packaged device could also be other types device such as quad-flat no-leads (QFN) device.

The packaged amplifier device 400 comprises a first input lead 302a, a second input lead 302b, and a third input lead 302c, an output lead 304, a first amplifier including a first transistor 338, a second amplifier including a second transistor 348, a third amplifier including a third transistor 358, a first inductive element L1, a second inductive element L2, a third inductive element L3, a fourth inductive element L4, a fifth inductive element L5, a sixth inductive element L6, a first capacitor formed within IPD 371, a second capacitor formed within IPD 372, and a third capacitor C3 formed within IPD 373.

Figure 5:
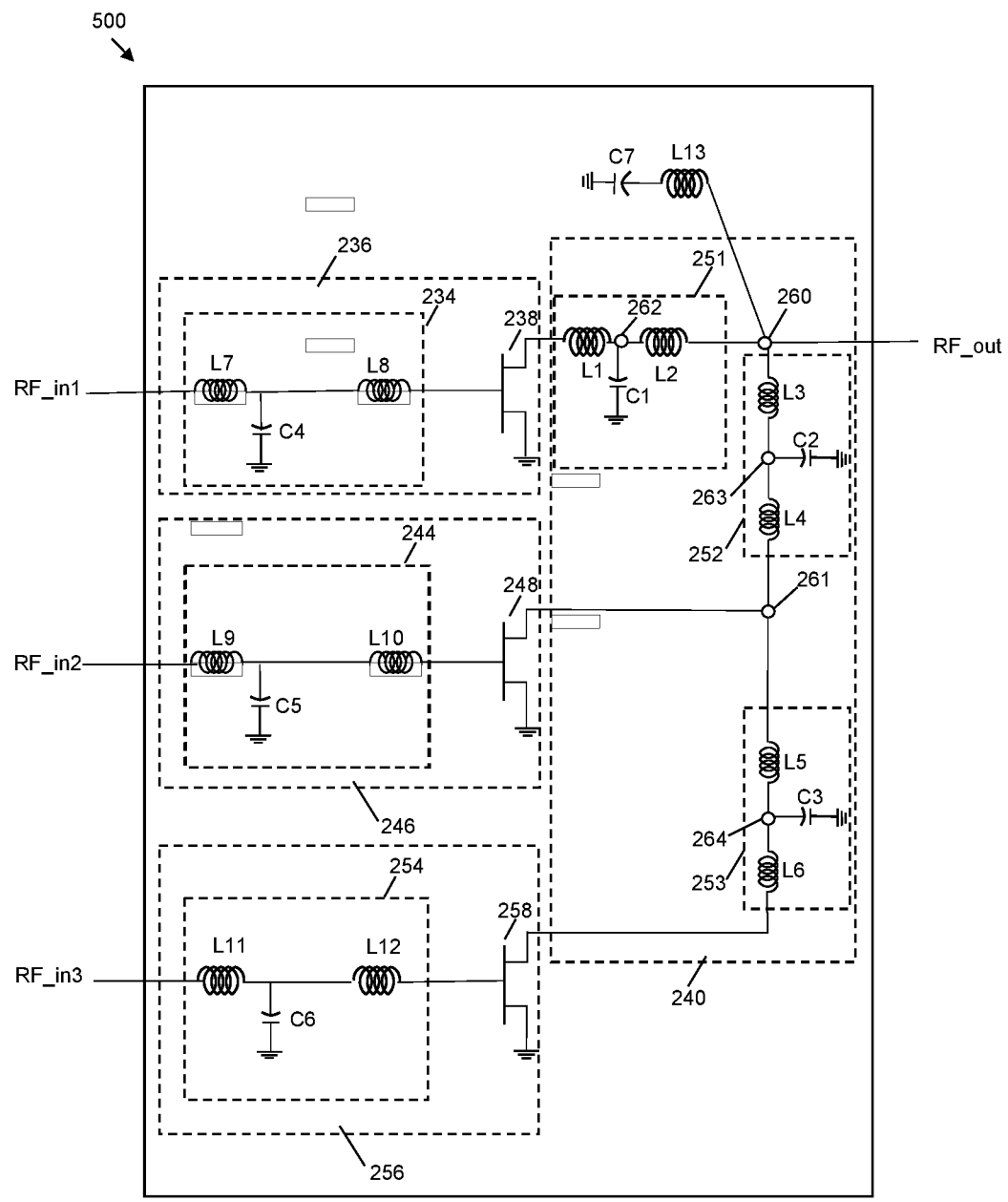
FIG. 5 illustrates a simplified schematic diagram of a Doherty amplifier with 2nd harmonic control.
Figure 9:
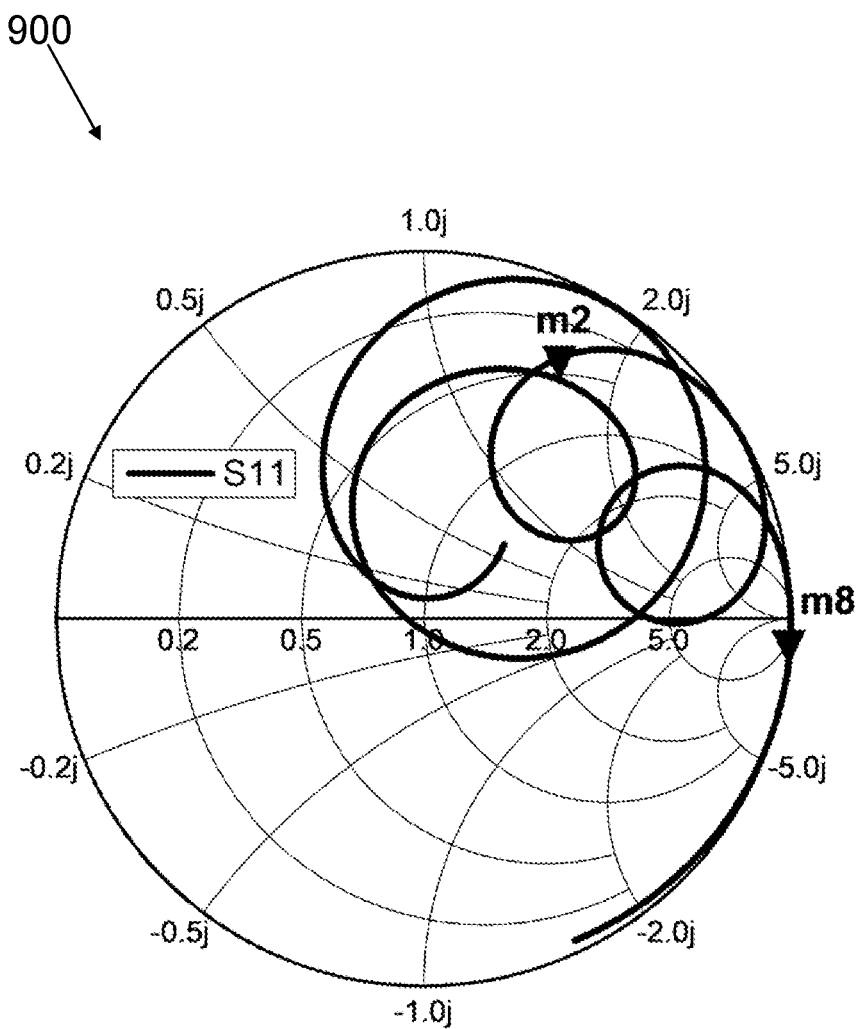
FIG. 9 illustrates a Smith chart showing an example load impedance for a Doherty amplifier with 2nd harmonic control.

FIG. 5 is a simplified schematic diagram of a Doherty amplifier 500 with 2nd harmonic control in accordance with an embodiment. Doherty amplifier 500 is identical to Doherty amplifier 200 (FIG. 2A), with one primary difference. The difference between the amplifiers 500, 200 of FIG. 5 and FIG. 2A is that the Doherty amplifier 500 comprises another inductive element L13 and capacitance C7 connected in series between the final summing node 260 and ground. The additional LC circuit comprising the additional inductive element L13 and capacitance C7 connected in series between the final summing node 260 and ground may be designed to resonate at two times of the center frequency. Accordingly, the additional LC circuit provides second harmonic control by shunting signal energy at the second harmonic frequency to ground. With this implementation, the second harmonic energy seen by the carrier amplifier is mitigated, and the amplifier performance is within the desirable efficiency area as shown in FIG. 9.

Figure 6:
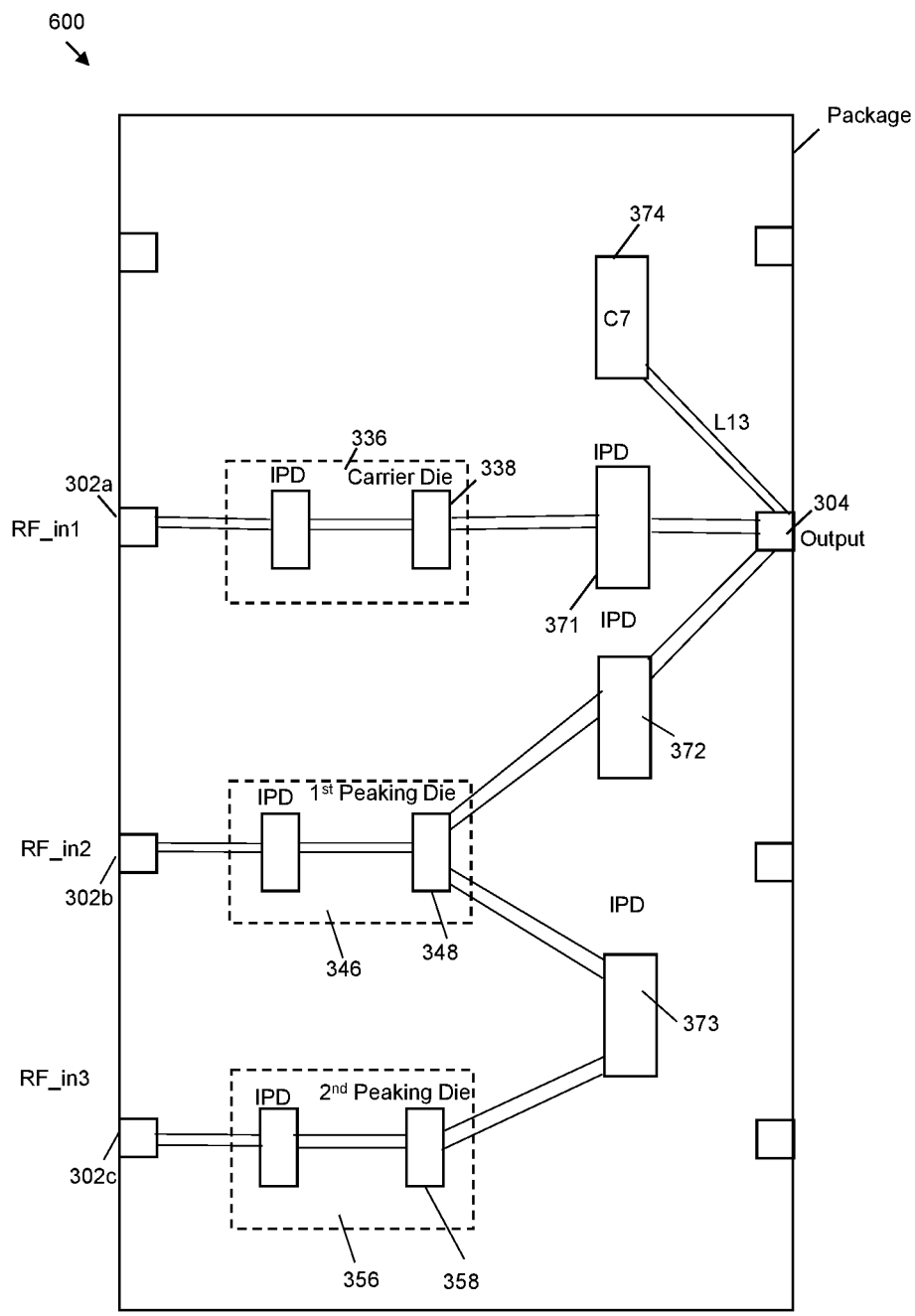
FIG. 6 illustrates the physical layout of an amplifier device corresponding to the Doherty amplifier of FIG. 5 in accordance with an embodiment.

FIG. 6 illustrates the physical layout of an amplifier device of FIG. 5 in accordance with an embodiment. In comparison with FIG. 3, the amplifier device 600 comprises an additional inductive element L13 and capacitor C7 connected in series between the output lead 304 and ground. The additional inductive element L13 (e.g., another set of bondwires) is coupled between the output lead 304 and a first terminal of the capacitor C7 (e.g., another capacitor integrated within another IPD). The second terminal of the capacitor C7 is coupled to ground.

Figure 7:
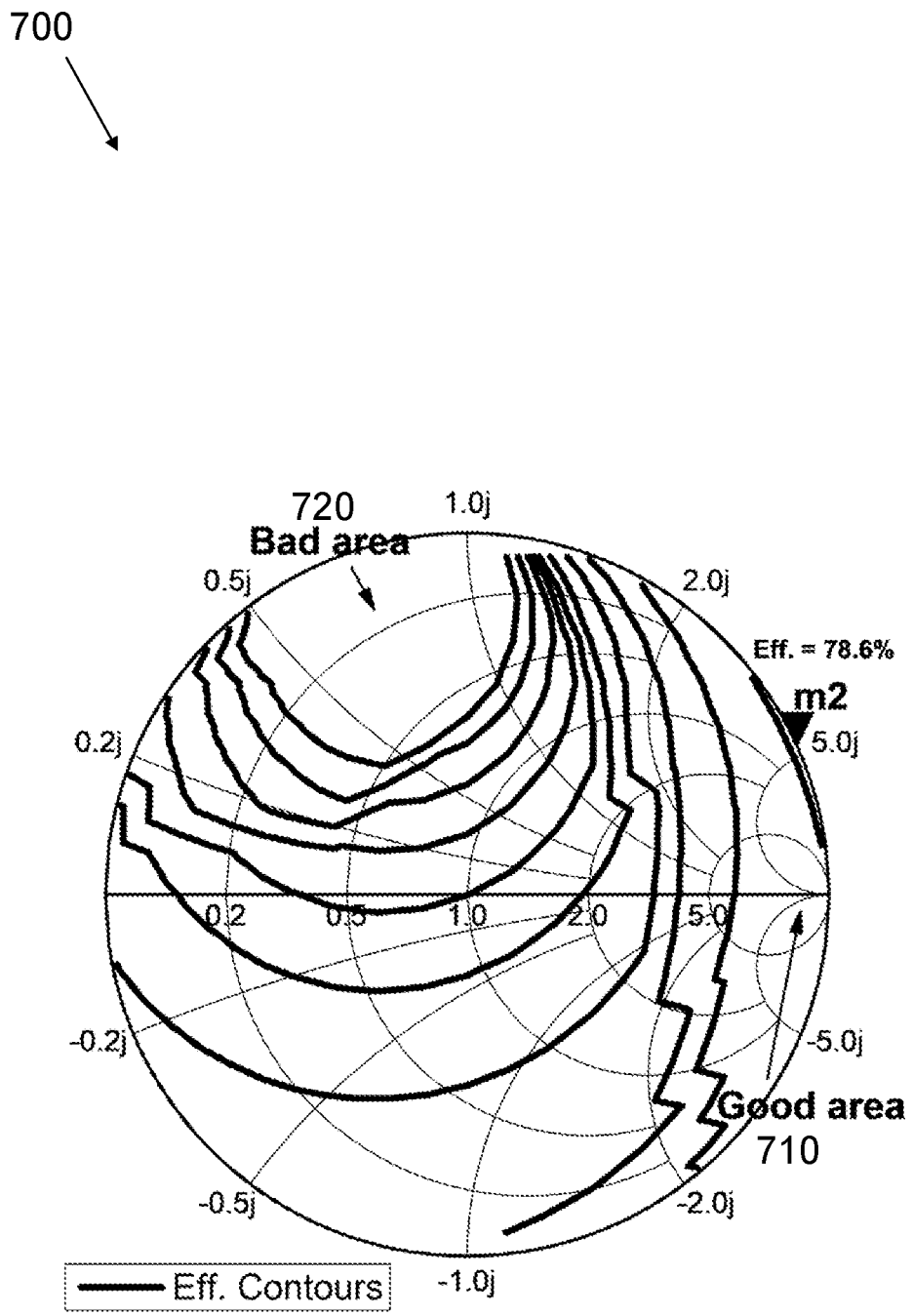
FIG. 7 illustrates a Smith chart illustrating second harmonic load-pull data.

FIG. 7 is a Smith chart 700 illustrating second harmonic load-pull data. The drain efficiency is not only determined by the fundamental impedance but also the second harmonic impedance. This data assumes that the fundamental impedance is fixed. For example, the drain efficiency can reach about 78% if the second harmonic impedance is in the good area 710 as shown in FIG. 7. However, the drain efficiency may only be about 60% if the second harmonic impedance is in the bad area 720. Therefore, the second harmonic impedance may significantly impact the efficiency, and the efficiency difference can reach 18%.

Figure 8:
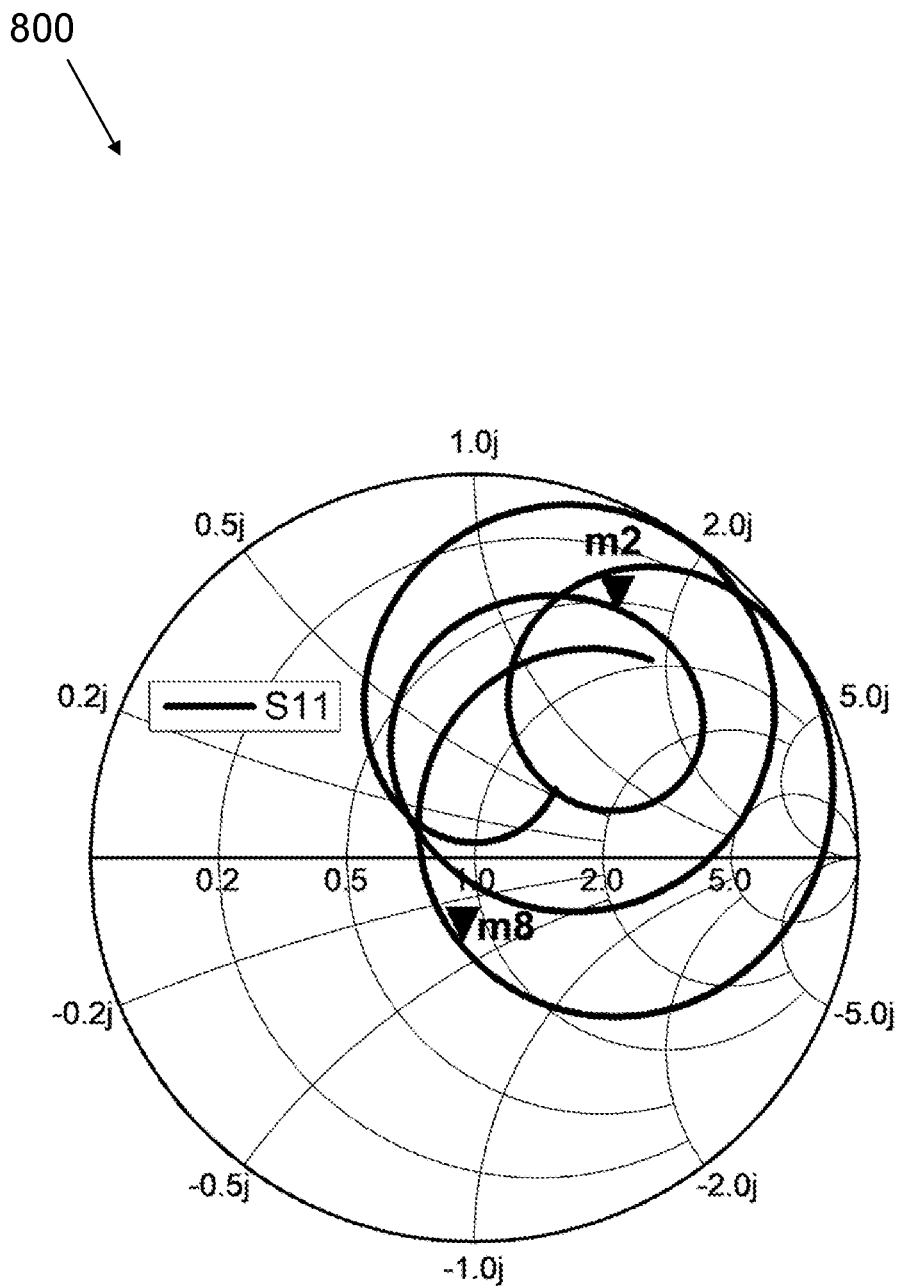
FIG. 8 illustrates a Smith chart showing an example load impedance for a Doherty amplifier without 2nd harmonic control.

FIG. 8 is a Smith chart 800 illustrating the impedance S11 presented to the carrier amplifier of the 3-way Doherty amplifier of FIG. 2A without 2nd harmonic control. The impedance includes fundamental impedance (m2) and second harmonic impedance (m8). As shown in FIG. 8, without second harmonic control, the drain efficiency may be about 70% which is affected by the second harmonic impedance and the load-pull data.

FIG. 9 is a Smith chart 900 illustrating the impedance presented to the carrier amplifier of the 3-way Doherty amplifier of FIG. 5 with 2nd harmonic control. As compared to FIG. 7, the fundamental impedance (m2) is fixed. The second harmonic impedance (m8) in FIG. 9 is within the good efficiency area. Adding the 2nd harmonic control, the second harmonic impedance (m8) will not be changed by any external matching networks connected to the output combiner circuit. The size of the gate periphery may change the impedance seen by the first amplifier.

FIG. 9 is a Smith chart 900 illustrating the impedance presented to the carrier amplifier of the 3-way Doherty amplifier of FIG. 5 with 2nd harmonic control for an embodiment of a Doherty amplifier that uses a gallium nitride (GaN) 1.52 mm die for the carrier amplifier. It should be understood that using a different die size will result in a different impedance, and the impedance will have a different curve from that shown in FIG. 9.

Thus, viewed from one perspective, the present application may enable advantages of high efficiency at deep output back-off (OBO), PCB size reduction, low cost, PCB design friendliness, application flexibility and short go-to-market time. Output Back-Off (OBO) is the power level at the output of RF amplifier relative to maximum output level possible using the RF amplifier. The deep output back off means that the value of the output back off is larger than the normal back off value. In one embodiment, the value of the normal output back-off is −8 dB and the value of the deep output back-off is −12 dB.

Figure 10:
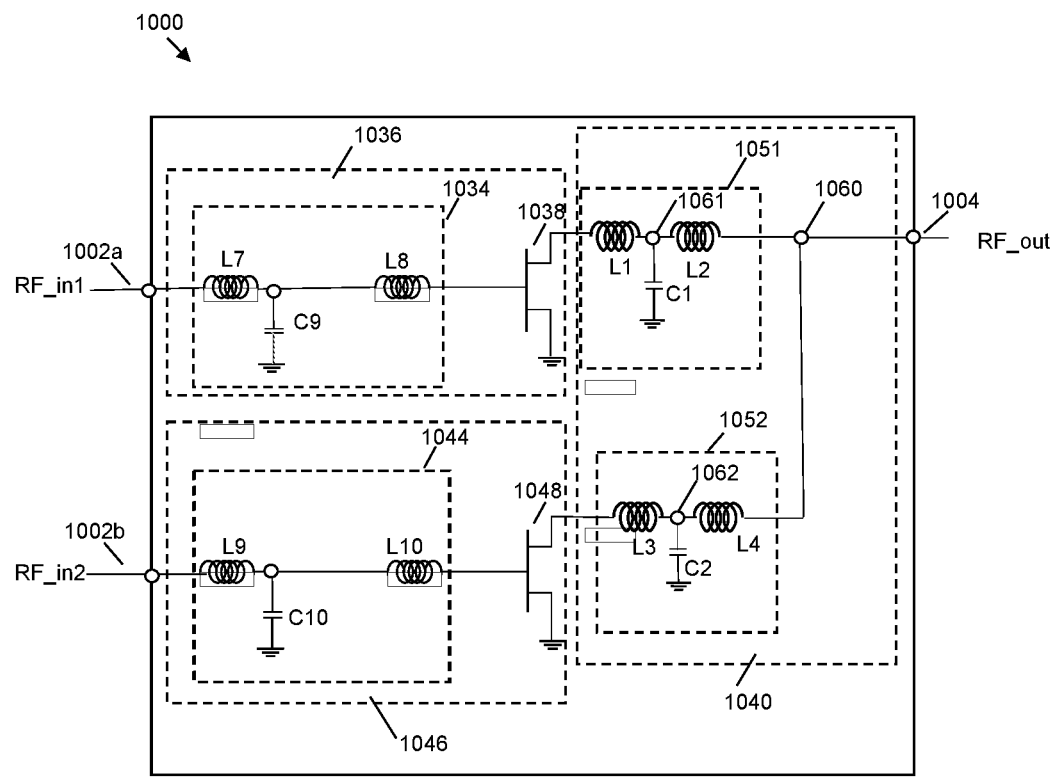
FIG. 10 illustrates a 2-way Doherty amplifier in accordance with an embodiment.

FIG. 10 is a simplified schematic diagram of a 2-way Doherty amplifier 1000 in accordance with another embodiment. Amplifier 1000 includes two separate inputs 1002a, 1002b and an output 1004, a first amplifier 1036, a second amplifier 1046, and an output combiner circuit 1040.

A first signal (RF_in1) received at the first input 1002a is amplified by the first amplifier 1036. A second signal (RF_in2) received at the second input 1002b is amplified by the second amplifier 1046.

The first amplifier 1036 includes a first transistor (carrier transistor) 1038 which may comprise a control terminal coupled to the input 1002a, a source terminal coupled to ground, and a drain terminal as a first amplifier output.

The second amplifier 1046 includes a second transistor (first peaking transistor) 1048 which may comprise a control terminal coupled to the second input 1002b, a source terminal coupled to ground, and a drain terminal as a second amplifier output.

The output combiner circuit 1040 is coupled to the first amplifier output and the second amplifier output. The output combiner circuit 1040 may comprise a first output network 1051 and a second output network 1052. The first output network 1051 may be coupled between the first amplifier output and a summing node 1060. The second output network 1052 may be coupled between the second amplifier output and the summing node 1060.

The first output network 1051 comprises a first inductive element L1 coupled between the first amplifier output and a intermediate node 1061, a first capacitor C1 coupled between the intermediate node 1061 and ground, and a second inductive element L2 coupled between the intermediate node 1062 and the summing node 1060. The first inductive element L1 comprises a set of bond wires, and the second inductive element L2 comprises another set of bond wires.

The second output network 1052 comprises a third inductive element L3 coupled between the second amplifier output and a second intermediate node 1062, a second capacitor C2 coupled between the second intermediate node 1062 and ground, and a fourth inductive element L4 coupled between the second intermediate node 1062 and the summing node 1060. The value of L3 equals to the value of L4.

The first output network imparts a phase delay of a first number of degrees between an input of the first output network and an output of the first output network. The second output network imparts a phase delay of second number of degrees between an input of the second output network and an output of the second output network. The difference between the second number of degrees and the first number of degrees is θ, and θ has a value other than zero.

To get the signal phase aligned at the summing node 1060, the phase offset θ should be added between the input signals of the first amplifier and the second amplifier. The phase shift between the first amplifier input and the second amplifier input is θ. The analytical expression for θ could be calculated as below:

$$\theta = \pm \cos^{-1} \sqrt{\frac{\beta^2 - \alpha\beta - \beta}{\beta^2 - 1}}, \tag{A2}$$

or $$\pm \left( \pi - \cos^{-1} \sqrt{\frac{\beta^2 - \alpha\beta - \beta}{\beta^2 - 1}} \right)$$

where α is denoted as the ratio of the peaking amplifier size (or periphery) to the carrier amplifier size, and β is the load modulation range, denoting the ratio of the load impedance seen by the intrinsic current generator of the carrier device at the design output back-off condition to the load impedance seen at the peak power operating.

The output combiner circuit 1040 comprises two CLCL circuits. The first CLCL circuit includes the first output network 1051 and the parasitic capacitor of the first transistor 1038 (Cds_c, not illustrated). The second CLCL circuit includes the second output network 1052 and the parasitic capacitor second transistor 1048 (Cds_p, not illustrated). In one embodiment, the value of L1 equals to the value of L2, and the value of L3 equals to the value of L4. Given that the Cds of the carrier and peaking transistors are known, the values of L1, L3, C1, C2 and the complex impedance at the combining node (or admittance GL+j*YL) could be obtained by the equations as below:

$$L_1 = \frac{B_c}{\omega D_c + B_c \omega^2 C_{ds\_c} + \omega} \tag{3}$$

-continued $$L3 = \frac{B_p}{\omega A_p + B_p \omega^2 C_{ds\_p} + \omega} \quad (4)$$

$$C_1 = \frac{(1 - D_c - B_c \omega C_{ds\_c})(1 + D_c + B_c \omega C_{ds\_c})}{\omega B_c} \quad (5)$$

$$C_2 = \frac{(1 - A_p - B_p \omega C_{ds\_p})(1 + A_p + B_p \omega C_{ds\_p})}{\omega B_p} \quad (6)$$

$$G_L = G \quad (7)$$

$$Y_L = \frac{D_c}{B_c} + \frac{A_p}{B_p} + \omega(C_{ds\_c} + C_{ds\_p}) - \frac{\alpha\beta - \beta + 1}{(\beta - 1)^2 A_p B_p} \quad (8)$$

where the Bc, Dc, Ap, Bp could be obtained by the equations (A5, A6, A7 and A8), and G is a free design variable in the equations (A5, A6, A7 and A8) as described as below.

$$D_c = \pm \sqrt{\frac{(\beta - \alpha - 1)}{(\beta^2 - 1) R_0 G}} \quad (A5)$$

$$B_c = \mp \mathrm{sign}(\cos\theta) \sin\theta \sqrt{\frac{\beta R_0}{G}} \quad (A6)$$

$$B_p = \mp \frac{\sin\theta}{\alpha} \sqrt{\frac{(\beta - \alpha - 1)(\beta + 1) R_0}{G(\beta - 1)}} \quad (A7)$$

$$A_p = \mp \mathrm{sign}(\cos\theta) \sqrt{\frac{\beta}{R_0 G}} \cdot \frac{\alpha}{\beta - 1} \quad (A8)$$

The design output back-off (OBO) in dB will be:

$$OBO = 10 \log(\beta(1+\alpha)) \quad (9)$$

where α is denoted as the ratio of the peaking amplifier size (or periphery) to the carrier amplifier size, and β is the load modulation range, denoting the ratio of the load impedance seen by the intrinsic current generator of the carrier device at the design output back-off condition to the load impedance seen at the peak power operating.

Figure 11:
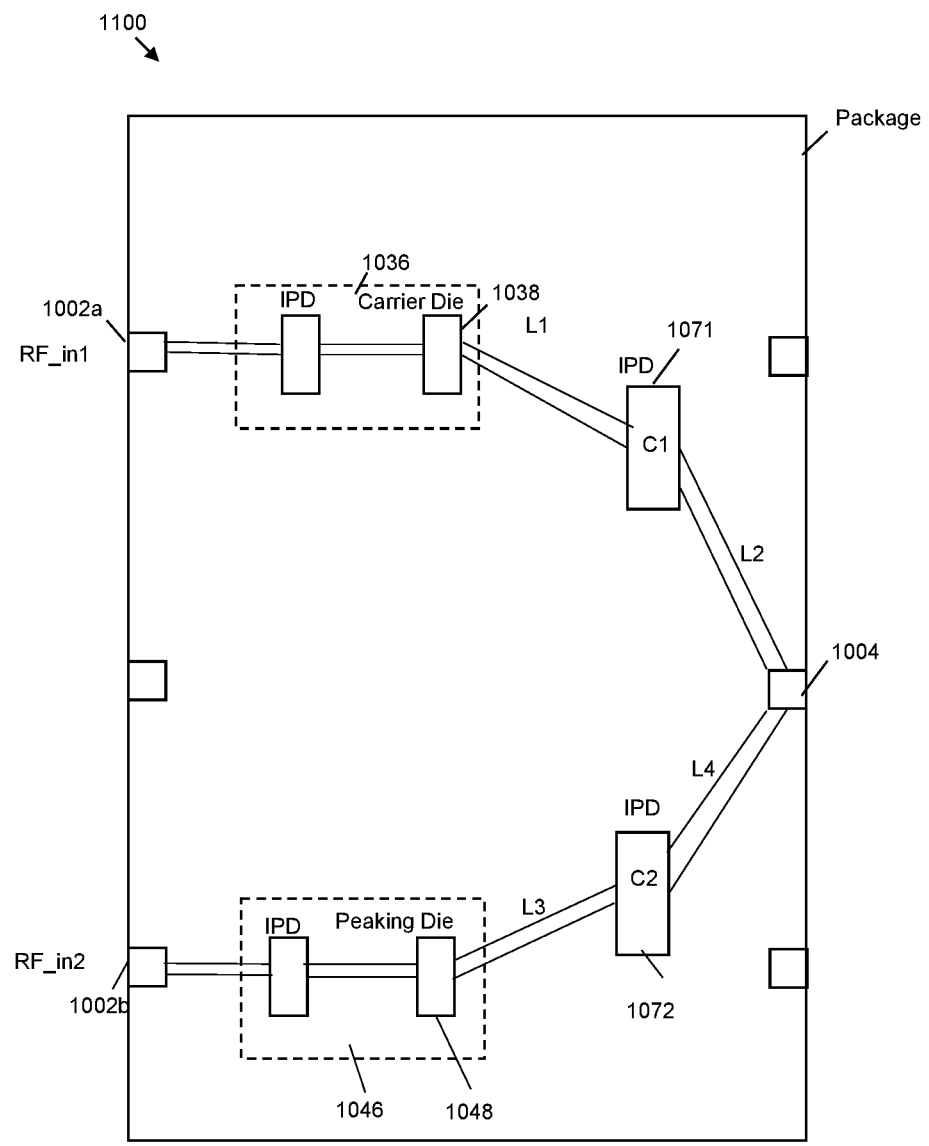
FIG. 11 illustrates the physical layout of a 2-way Doherty amplifier device in accordance with an embodiment.

FIG. 11 illustrates the physical layout of the 2-way amplifier device 1000 of FIG. 10 in accordance with an embodiment. The amplifier device 1100 includes a portion of a Doherty amplifier.

Referring now to FIG. 11, the physical layout of the amplifier device 1000 is illustrated, according to one or more embodiments. The packaged amplifier device 1000 comprises a first input lead 1002a, a second input lead 1002b, an output lead 1004, a first amplifier 1036, a second amplifier 1046, a first inductive element L1, a second inductive element L2, a third inductive element L3, a fourth inductive element L4, a first capacitor C1 and a second capacitor C2. The L1, L2, L3, and L4 inductive elements each could be implemented by bond wires. The C1 and C2 capacitors each could be implemented as an integrated capacitor within IPDs 1071, 1072, respectively.

The first amplifier 1036 may include a first transistor 1038. The first transistor 1038 comprises a first transistor input coupled to a first input lead 1002a, and a first transistor output. The second amplifier 1046 comprises a second transistor 1048. The second transistor 1048 includes a second transistor input coupled to the second input lead 1002b, and a second transistor output.

The first inductive element L1 is coupled between the first transistor output and a first terminal of the first capacitor C1 that is integrated within a first IPD 1071, and the second inductive element L2 is coupled between the output lead 904 and the first terminal of the first capacitor C1. The second terminal of the first capacitor C1 is coupled to ground.

The third inductive element L3 is coupled between the second transistor output and a first terminal of the second capacitor C2 that is integrated within a second IPD 1072, and the fourth inductive element L4 is coupled between the output lead 904 and the first terminal of the second capacitor C2. The second terminal of the second capacitor C2 is coupled to ground.

Referring now to the use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the application as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A Doherty amplifier device, comprising:
   a first input terminal;
   a second input terminal;
   a third input terminal;
   an integrated output combiner circuit comprising a first output network, a second output network, a third output network, an intermediate summing node, and a final summing node;
   a carrier amplifier including a first amplifier input coupled to the first input terminal, and a first amplifier output coupled through the first output network to the final summing node, wherein the first output network includes a first inductive element in the form of a first set of wirebonds coupled between the first amplifier output and a first intermediate node, a second inductive element in the form of a second set of wirebonds coupled between the first intermediate node and the final summing node, and a first capacitor coupled between the first intermediate node and a ground plane;

a first peaking amplifier including a second amplifier input coupled to the second input terminal, and a second amplifier output, wherein the second amplifier output is directly coupled to the intermediate summing node, the second amplifier output and the intermediate summing node are coupled through the second output network to the final summing node, the second output network includes a third inductive element in the form of a third set of wirebonds coupled between the final summing node and a second intermediate node, a fourth inductive element in the form of a fourth set of wirebonds coupled between the second intermediate node and the intermediate summing node, and a second capacitor coupled between the second intermediate node and the ground plane; and a second peaking amplifier including a third amplifier input coupled to the third input terminal, and a third amplifier output coupled through the third output network to the intermediate summing node, wherein the third output network includes a fifth inductive element in the form of a fifth set of wirebonds coupled between the intermediate summing node and a third intermediate node, a sixth inductive element in the form of a sixth set of wirebonds coupled between the third intermediate node and the third amplifier output, and a third capacitor coupled between the third intermediate node and the ground plane, wherein the first output network imparts a phase delay of 90 degrees between an input of the first output network and an output of the first output network and provides a first impedance, the second output network imparts a phase delay of 90 degrees between an input of the second output network and an output of the second output network and provides a second impedance, and the third output network imparts a phase delay of 90 degrees between an input of the third output network and an output of the third output network and provides a third impedance.

2. The device of claim 1, wherein the phase shift between the first amplifier input and the second amplifier input is 0°, and the phase shift between the second amplifier input and the third amplifier input is 90°.

3. The device of claim 1, wherein the final summing node comprises an output terminal of the device.

4. The device of claim 1, further comprising:
a conductive substrate, wherein the first, second, and third power transistors and the first, second, and third capacitors are coupled to a surface of the conductive substrate, and the conductive substrate corresponds to the ground plane; and
plastic molding compound applied over the first, second, and third power transistors.

5. The device of claim 1, wherein the device is a packaged amplifier device that has a device type selected from a group consisting of a dual-flat no-leads device and a quad-flat no-leads device.

6. The device of claim 1, wherein the first capacitor is integrated within a first integrated passive device (IPD), the second capacitor is integrated within a second IPD, and the third capacitor is integrated within a third IPD.

7. The device of claim 1, wherein:
the device is a packaged amplifier device;
the first, second, and third terminals are first, second, and third leads of the packaged amplifier device;
the final summing node comprises an output terminal of the device; and
the output terminal corresponds to a fourth lead of the packaged amplifier device.

8. The device of claim 1, further comprising a resonator coupled between the final summing node and the ground plane, wherein the resonator comprises a seventh inductive element and a fourth capacitor coupled in series, and the resonator is configured to resonate at a second harmonic frequency of a center frequency of operation of the device.

9. The device of claim 1, wherein:
the carrier amplifier comprises a first input impedance matching network and a first power transistor, wherein the first input impedance matching network is configured to match an impedance between the first input terminal and the first power transistor;
the first peaking amplifier comprises a second input impedance matching network and a second power transistor, wherein the second input impedance matching network is configured to match an impedance between the second input terminal and the second power transistor; and
the second peaking amplifier comprises a third input impedance matching network and a third power transistor, wherein the third input impedance matching network is configured to match an impedance between the third input terminal and the third power transistor.

10. The device of claim 9, wherein:
the first power transistor is a first field effect transistor with a first gate terminal coupled to the first input impedance matching network, a first drain terminal coupled to the first inductive element, and a first source terminal coupled to the ground plane,
the second power transistor is a second field effect transistor with a second gate terminal coupled to the second input impedance matching network, a second drain terminal coupled to the intermediate summing node, and a second source terminal coupled to the ground plane, and
the third power transistor is a third field effect transistor with a third gate terminal coupled to the third input impedance matching network, a third drain terminal coupled to the sixth inductive element, and a third source terminal coupled to the ground plane.

11. A Doherty amplifier, comprising:
a first input;
a second input;
a third input;
an output;
an output combiner circuit with first, second, and third combining network inputs, first, second, and third output networks, an intermediate summing node corresponding to the second combining network input, a final summing node, and a combining network output corresponding to the final summing node and coupled to the output directly;
a carrier amplifier including a first amplifier input coupled to the first input, and a first amplifier output coupled to the first combining network input;
a first peaking amplifier including a second amplifier input coupled to the second input, and a second amplifier output directly coupled to the second combining network input; and
a second peaking amplifier including a third amplifier input coupled to the third input, and a third amplifier output coupled to the third combining network input, wherein the first output network includes a first inductive element in the form of a first set of wirebonds coupled between the first combining network input and a first intermediate node, a second inductive element in the form of a second set of wirebonds coupled between the first intermediate node and the combining network output, and a first capacitor coupled between the first intermediate node and a ground plane, wherein the second output network includes a third inductive element in the form of a third set of wirebonds coupled between the combining network output and a second intermediate node, a fourth inductive element in the form of a fourth set of wirebonds coupled between the second intermediate node and the second combining network input, and a second capacitor coupled between the second intermediate node and the ground plane, wherein the third output network includes a fifth inductive element in the form of a fifth set of wirebonds coupled between the second combining network input and a third intermediate node, a sixth inductive element in the form of a sixth set of wirebonds coupled between the third intermediate node and the third combining network input, and a third capacitor coupled between the third intermediate node and the ground plane, and wherein the first output network imparts a phase delay of 90 degrees between an input of the first output network and an output of the first output network and provides a first impedance, the second output network imparts a phase delay of 90 degrees between an input of the second output network and an output of the second output network and provides a second impedance, and the third output network imparts a phase delay of 90 degrees between an input of the third output network and an output of the third output network and provides a third impedance.

12. The Doherty amplifier of claim 11, wherein:
the carrier amplifier comprises a first input impedance matching network and a first power transistor, wherein the first input impedance matching network is configured to match an impedance between the first input and the first power transistor;
the first peaking amplifier comprises a second input impedance matching network and a second power transistor, wherein the second input impedance matching network is configured to match an impedance between the second input and the second power transistor; and
the second peaking amplifier comprises a third input impedance matching network and a third power transistor, wherein the third input impedance matching network is configured to match an impedance between the third input and the third power transistor.

13. The Doherty amplifier of claim 11, wherein the phase shift between the first amplifier input and the second amplifier input is 0°, and the phase shift between the second amplifier input and the third amplifier input is 90°.

14. The Doherty amplifier of claim 11, wherein the final summing node comprises the output of the Doherty amplifier.

15. The device of claim 12, further comprising:
a conductive substrate, wherein the carrier and peaking amplifiers and the first and second capacitors are coupled to a surface of the conductive substrate, and the conductive substrate corresponds to the ground plane; and plastic molding compound applied over the carrier and peaking amplifiers.

16. The device of claim 12, wherein the device is a packaged amplifier device that has a device type selected from a group consisting of a dual-flat no-leads device and a quad-flat no-leads device.

17. The device of claim 12, wherein the device is a packaged amplifier device, and the first and second terminals are first and second leads of the packaged amplifier device.

18. The device of claim 17, wherein the output terminal corresponds to a summing node and to a fourth lead of the packaged amplifier device.

19. A Doherty amplifier device, comprising:
a first input terminal;
a second input terminal;
an output terminal;
an integrated output combiner circuit comprising a first output network and a second output network;
a carrier amplifier including a first amplifier input coupled to the first input terminal, and a first amplifier output coupled through the first output network to the output terminal, wherein the first output network includes a first inductive element in the form of a first set of wirebonds coupled between the first amplifier output and a first intermediate node, a second inductive element in the form of a second set of wirebonds coupled between the first intermediate node and the output terminal, and a first capacitor coupled between the first intermediate node and a ground plane; and
a peaking amplifier including a second amplifier input coupled to the second input terminal, and a second amplifier output coupled through the second output network to the output terminal, wherein the second output network includes a third inductive element in the form of a third set of wirebonds coupled between the second amplifier output and a second intermediate node, a fourth inductive element in the form of a fourth set of wirebonds coupled between the second intermediate node and the output terminal, and a second capacitor coupled between the second intermediate node and the ground plane,
wherein the first capacitor is integrated within a first integrated passive device (IPD),
wherein the second capacitor is integrated within a second IPD, and
wherein the device is a packaged amplifier device, and the first input terminal, the second input terminal, and the output terminal are first, second, and third leads of the packaged amplifier device, and the lead corresponds to a summing node for signals produced by the first and second output networks.

20. The Doherty amplifier device of claim 19, wherein a phase shift between the first amplifier input and the second amplifier input is $\theta$, wherein the first output network imparts a phase delay of a first number of degrees between an input of the first output network and an output of the first output network, wherein the second output network imparts a phase delay of a second number of degrees between an input of the second output network and an output of the second output network, and wherein the difference between the second number of degrees and the first number of degrees is $\theta$, and $\theta$ is a number of degrees other than zero.

* * * * *